United States Patent [19]
Lee et al.

[11] Patent Number: 6,040,725
[45] Date of Patent: Mar. 21, 2000

[54] DYNAMICALLY CONFIGURABLE VARIABLE FREQUENCY AND DUTY CYCLE CLOCK AND SIGNAL GENERATION

[75] Inventors: William Robert Lee; Leland Duane Richardson, both of Apex, N.C.

[73] Assignee: International Business Machines Corporation, Armonk, N.Y.

[21] Appl. No.: 09/089,757

[22] Filed: Jun. 2, 1998

[51] Int. Cl.[7] .................................................. H03K 1/04
[52] U.S. Cl. .......................... 327/175; 327/115; 327/116; 327/298; 377/54
[58] Field of Search .................. 327/175, 115, 327/116, 298; 377/54

[56] References Cited

U.S. PATENT DOCUMENTS

| | | | |
|---|---|---|---|
| 4,891,825 | 1/1990 | Hansen | 377/110 |
| 5,144,571 | 9/1992 | Thong | 364/721 |
| 5,337,339 | 8/1994 | Hillstrom | 377/52 |
| 5,345,109 | 9/1994 | Mehta | 307/271 |
| 5,371,772 | 12/1994 | Al-Khairi | 377/47 |
| 5,477,181 | 12/1995 | Li et al. | 327/258 |
| 5,687,202 | 11/1997 | Eitrheim | 327/156 |
| 5,719,510 | 2/1998 | Weidner | 327/119 |

OTHER PUBLICATIONS

Programmable Square–Wave Clock Divider, *IBM Technical Disclosure Bulletin*, vol. 30, No. 12, pp. 11–13 (May 1988).

Integer Divisible Frequency Divider with Symmetric Outputs, *IBM Technical Disclosure Bulletin*, vol. 39, No. 05, pp. 187–188 (May 1996).

*Primary Examiner*—Margaret R. Wambach
*Attorney, Agent, or Firm*—John D. Flynn; Myers, Bigel Sibley and Sajovec, LLP

[57] ABSTRACT

A variable clock generator includes a clock multiplier that generates from a reference clock at least two clock signals which are out of phase with each other and a clock divider which receives a plurality of divider patterns and which receives at least two clock signals from the clock multiplier. The clock divider generates an output clock based on the divider patterns and the clock signals. In a particular embodiment, the clock divider includes a plurality of loadable linear feedback shift registers each having an output. An EXCLUSIVE OR gate that is responsive to the outputs of the linear feedback shift registers then EXCLUSIVE ORs the outputs of the linear feedback shift registers to produce the output clock. Preferably, the size of the linear feedback shift registers corresponds to the size of the divider patterns.

24 Claims, 7 Drawing Sheets

DYNAMICALLY CONFIGURABLE VARIABLE FREQUENCY AND DUTY CYCLE CLOCK AND SIGNAL GENERATION

FIELD OF THE INVENTION

The present invention relates generally to the generation of signals and more particularly, to the generation of signals with differing duty cycles and/or frequencies.

BACKGROUND OF THE INVENTION

In many modern digital applications, a clock signal is required to control the timing within the circuitry. Various systems have been developed for generating clock signals. Some of these systems are described in U.S. Pat. Nos. 4,891,825, 5,345,109, 5,371,772, and 5,477,181. Similarly, IBM Technical Disclosure Bulletin Vo. 39, No. 5, pp. 187–188, May 1996 describes a system for an integer divisible frequency divider. IBM Technical Disclosure Bulletin Vol. 30, No. 12, pp. 11–13, May 1988 describes a programmable square wave clock divider. While these references generally describe programmable clock generators, they typically do not provide for variations in duty cycle of the generated clocks. Variations in duty cycle and/or frequency may be useful in several situations which arise in modern digital circuits.

As digital circuits such as processors have increased in speed, the generation of accurate clock signals has generally become more important to assure proper operation of the circuit. For example, as integrated circuits have been designed for low power consumption, clock gating or similar techniques have become a common practice to reduce power. Conventional clock gating utilizes a clock gate signal to deactivate clocks. Typically, the clock to be gated operates at a 50% duty cycle which may result in the clock gate signal needing to arrive before the 50% point of the clock cycle. As clock frequencies have increased, this timing requirement of the gating signal may be difficult to meet. Thus, it may be desirable to change the duty cycle of the clock to allow more time to generate the gate signal.

Another example of a situation where variation of duty cycle and/or frequency may be beneficial is in interfacing to memory. In many designs that interface to memory, such as Dynamic Random Access Memory (DRAM) or on-chip static random access memory (SRAM), the timing requirements of the interface may require use of both edges of the clock. For example, the Column Address Select (CAS) signal for a 70 ns DRAM may have a minimum active time of 10 ns and a minimum inactive time of 15 ns. To maximize performance, it would be desirable to provide a CAS signal with a duty cycle optimized to these requirements. Thus, changing from the conventional 50% duty cycle clock may be beneficial as it may allow timing of the CAS signal to more closely follow the requirements of the memory.

Similarly, pulse shrinkage of clock signals as a result of capacitance on a printed circuit board may be compensated for by altering the duty cycle of the clock. For example, changing the duty cycle of a clock from 50% to 55% may compensate for the capacitance of the printed circuit board so that a 50% duty cycle clock is provided when the pulse shrinks from the capacitance on the printed circuit board.

As the above discussion makes clear, many situations exist where it may be beneficial to adjust the duty cycle or frequency of a clock signal to provide improved timing performance. However, as is also clear from the above discussions, improvements are desirable in existing clock generation systems to provide such dynamic control of timing of the generated clocks.

OBJECTS AND SUMMARY OF THE INVENTION

In view of the above limitations of existing clock generation systems, it is an object of the present invention to provide a clock generator which may provide differing frequency and duty cycle clocks.

Another object of the present invention is to generate clocks of differing frequencies and/or duty cycles with the same clock generation circuitry.

Still another object of the present invention is to provide for the generation of clocks without producing glitches on the output clock.

These and other objects of the present invention are provided by a variable clock generator which includes a clock multiplier that generates at least two clock signals which are out of phase with each other. A clock divider receives at least one divider pattern and receives the two or more clock signals from the clock multiplier. The clock divider generates an output clock based on the divider patterns and the clock signals.

In a particular embodiment, the clock divider includes a plurality of loadable linear feedback shift registers each having an output. An EXCLUSIVE OR gate, that is responsive to the outputs of the linear feedback shift registers, EXCLUSIVE ORs the outputs of the linear feedback shift registers to produce the output clock. Preferably, the size of the linear feedback shift registers corresponds to the size of the divider patterns.

By providing a loadable clock divider which utilizes out of phase clocks, the present invention can generate clocks with variations in duty cycles and frequencies smaller than the period of the clocks used to clock the divider. Furthermore, the use of loadable patterns to control the divider allows for changing the pattern and thereby changing the output clock. By changing the patterns which are loaded in the clock divider both the frequency and the duty cycle of the output clock may be varied. The use of an EXCLUSIVE OR function in combination with the out of phase clocks to generate the output clock reduces the likelihood that a glitch will be generated on the output because the signals which generate the clock do not change at the same time. Furthermore, the present invention may be utilized with any number of out of phase clocks to provide further refinement in the duty cycle or frequency of the output signal. Accordingly, the present invention may be used with, for example, two phase or four phase clocks with a shift register associated with each phase. Thus, the present invention provides a clock generator which may provide differing frequency and duty cycle clocks without producing glitches on the output clock.

In an further embodiment of the present invention a clock divider is provided where the linear feedback shift registers each include an alternating series of multiplexers and latches including a first multiplexer and a last latch. The outputs of a preceding latch are connected to the input of a succeeding multiplexer and the outputs of the preceding multiplexer are connected to the input of a succeeding latch. The output of the last latch is connected to the input of the first multiplexer. Each of the multiplexers further include an input for receiving a bit of a divider pattern. Furthermore, each of the multiplexers may also receive as an input the output of the last latch.

By feeding back the output of the last latch to the multiplexers, the present invention provides variable size linear feedback shift registers. Thus, the size of the shift register may be selected to correspond to the loaded bit pattern to provide further flexibility in the generation of signals. By selecting the size of the shift register to correspond to the loaded bit pattern particular embodiments of the present invention may to provide a wider range of differing frequencies and duty cycles than if the size of the shift registers are fixed.

In another embodiment of the present invention, the latches of the linear feedback shift registers comprise a plurality of level sensitive scan design latches. The two clock signals may also be a master clock and a slave clock. In such an embodiment, the latches of the linear feedback shift registers may be a master latch clocked by the master clock and a slave latch which receives an output of the master latch and is clocked by the slave clock.

In a particular embodiment of the present invention the clock divider includes two linear feedback shift registers and the clock multiplier provides two clocks which are about 180 degrees out of phase.

The present invention may also provide a method and apparatus for generating a clock from at least two out of phase clocks. The clock is generated by generating at least two time varying bit patterns associated with an output clock to be generated based on at least two out of phase clocks and EXCLUSIVE ORing the time varying bit patterns to generate the output clock. The two time varying bit patterns may be generated by loading a first linear feedback shift register which is clocked by a first of the clocks with a first bit pattern corresponding to a first characteristic of the clock to be generated. A second linear feedback shift register which is clocked by a second of the clocks is loaded with a second bit pattern corresponding to a second characteristic of the clock to be generated. Then, the first and second linear feedback shift registers are clocked with the first and second clocks so as to provide a first time varying output of the first linear feedback shift register and a second time varying output of the second linear feedback shift register. The first output and the second output are then EXCLUSIVE ORed so as to provide the clock to be generated.

In a particular embodiment of the present invention, a feedback point of the first linear feedback shift register and a feedback point of the second linear feedback shift register are selected based on the number of bits in the first bit pattern and the second bit pattern. Furthermore, the first bit pattern and the second bit pattern may be selected to specify the rising and falling edges of the output clock. The first bit pattern and the second bit pattern may be determined based on the period of the output clock and the number of cycles of the out of phase clocks that the output clock is to be active.

In another embodiment of the present invention, the first linear feedback shift register and the second linear feedback shift register are loaded by scanning a first bit pattern corresponding to a first characteristic of the clock to be generated into the first linear feedback shift register and a second bit pattern corresponding to a second characteristic of the clock to be generated into the second linear feedback shift register.

As will be appreciated by those of skill in this art, the above described aspects of the present invention may also be provided as methods or apparatus.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The present invention will now be described with respect to FIGS. 1 through 4 and 6 which are block diagrams and flowcharts illustrating the operations of a clock generation system utilizing the present invention. It will be understood that each block of the flowchart illustration, and combinations of blocks in the flowchart illustration, can be implemented by computer program instructions. These program instructions may be provided to a processor to produce a machine, such that the instructions which execute on the processor create means for implementing the functions specified in the flowchart block or blocks. The computer program instructions may be executed by a processor to cause a series of operational steps to be performed by the processor to produce a computer implemented process such that the instructions which execute on the processor provide steps for implementing the functions specified in the flowchart or flow diagram block or blocks.

Accordingly, blocks of the flowchart or flow diagram illustrations support combinations of means for performing the specified functions, combinations of steps for performing the specified functions and program instruction means for performing the specified functions. It will also be understood that each block of the flowchart or flow diagram illustrations, and combinations of blocks in the flowchart or flow diagram illustrations, can be implemented by special purpose hardware-based systems which perform the specified functions or steps, or combinations of special purpose hardware and computer instructions. Accordingly, the present invention may take the form of an entirely hardware implementation, an entirely software implementation, or a combination of hardware and software.

The present invention provides for the generation of an output clock from a reference clock. The reference clock may be multiplied and phase shifted to provide phase shifted clocks which are then utilized by a clock divider to generate the output clock. Utilizing a clock divider according to the present invention allows for the creation of an output clock at any frequency in 1/N integer multiples of the frequency of the phase shifted clocks where N is an integer number. Furthermore, the pulse width of the generated clock may be as small as 1/X the frequency of the phase shifted clocks or may be a multiple of 1/X the frequency of the phase shifted clocks where X is the number of equally phase shifted clocks. Alternatively, if the phase shifted clocks are not equally phase shifted, the minimum pulse width which may be generated will be the duration between the phase shifted clocks.

Figure 1:
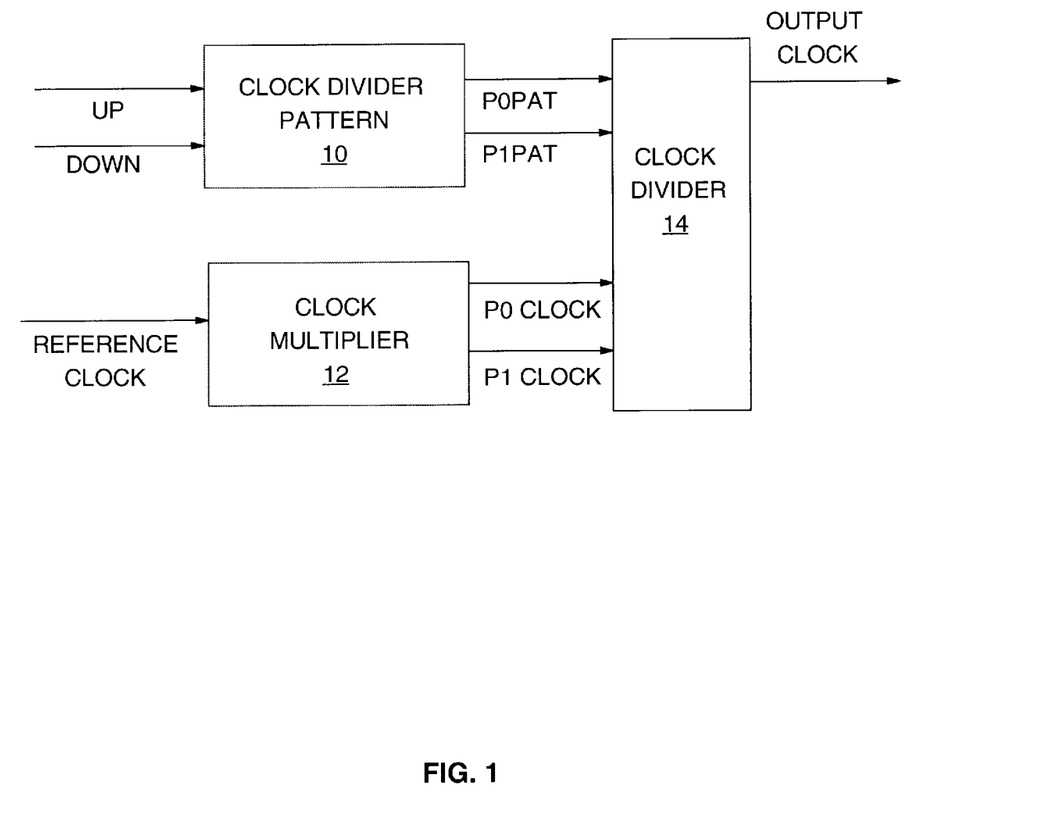
FIG. 1 is a block diagram of a clock generation circuit according to the present invention.

FIG. 1 illustrates one embodiment of a clock generation circuit according to the present invention. As seen in FIG. 1, a clock divider pattern generator 10 receives information about the period of the clock to be generated and the duration that the clock is to be active during the period. Thus the frequency and duty cycle of the clock to be generated may be determined.

A clock multiplier 12 receives a reference clock and outputs at least two phase shifted clocks illustrated as P0 Clock and P1 Clock in FIG. 1. The frequency of the P0 Clock and P1 Clock may be any desired frequency but are preferably selected in light of the above discussion as an integer multiple of the desired output frequency where the integer multiple may be one.

The clock divider pattern generator 10 generates clock divider patterns which are provided to the clock divider 14. The clock divider 14 receives the patterns and the multiplied out of phase clocks and generates the output clock based on the patterns and the received clocks. Preferably, the period and duration that the clock to be generated is active is specified to the clock divider pattern generator 10 in terms of the number of cycles of the phase shifted clocks such as P0 clock or P1 Clock in FIG. 1. However, as will be appreciated by those of skill in the art, the desired characteristics of the output clock may be specified in any number of ways.

As will be appreciated by those of skill in the art, the clock divider pattern generator may be a software implementation executing on a general purpose processor which generates the bit patterns of the divider patterns. Furthermore, if dynamic changes in the output clock frequency or duty cycle are not required, the clock divider patterns could be generated once and then provided to the clock divider 14 as hardwired inputs or through other loading means such as scanning the values into the clock divider in a level sensitive scan design (LSSD) implementation of the present invention. Alternatively, a number of pre-generated clock divider patterns could be utilized and stored in a memory device. In such an implementation, the divider pattern corresponding to the desired output clock could then be selected from the memory device and provided to the clock divider 14. As is evident from the above discussion, any number of ways of generating and/or providing divider patterns to the clock divider 14 may be utilized while still benefitting from the teachings of the present invention.

The clock multiplier 12 may be any clock multiplier which is capable of generating out of phase clocks for use by the clock divider. Clock multiplier circuits suitable for use in the present invention are known to those of skill in the art.

Figure 2:
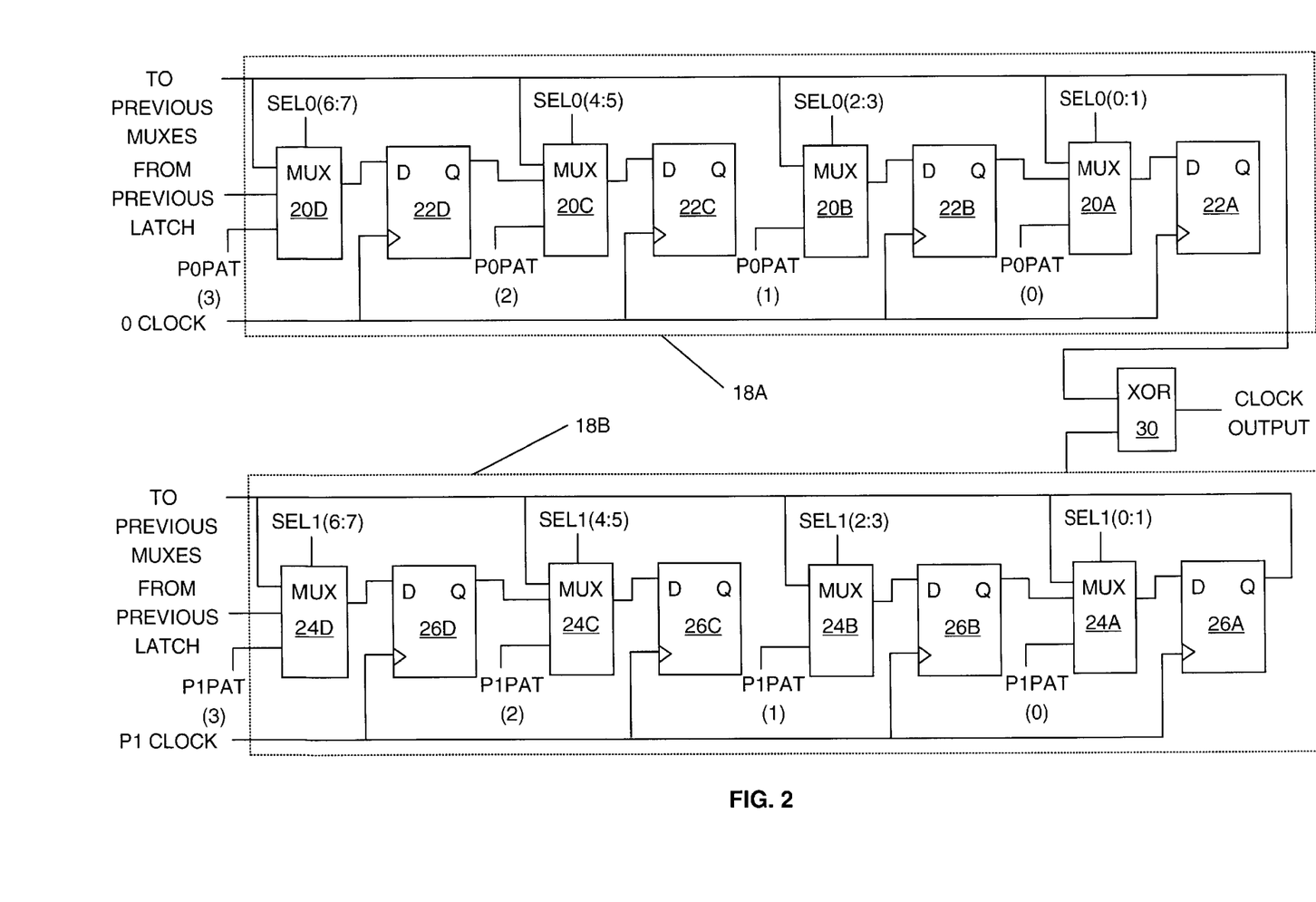
FIG. 2 is a block diagram of one embodiment of a clock divider circuit according to the present invention.

One implementation of the clock divider 14 of FIG. 1 is seen in FIG. 2. As seen in FIG. 2, the clock divider may include a plurality of linear feedback shift registers 18a and 18b. The linear feedback shift registers may include any number of latches but should include at least one latch for each bit of the divider pattern that is provided to the clock divider 14. FIG. 2 illustrates a 4 bit portion of two linear feedback shift registers.

The linear feedback shift registers 18a and 18b include an alternating series of multiplexers 20a through 20d and 24a through 24d and latches 22a through 22d and 26a through 26d. The linear feedback shift registers 18a and 18b include a first multiplexer 20d and 24d and a last latch 22a and 26a. As is seen in FIG. 2, the output of a preceding latch is connected to the input of a succeeding multiplexer and the output of the preceding multiplexer is connected to the input of a succeeding latch. Furthermore, the output of the last latch 22a and 26a is connected to the input of the first multiplexer 20d and 24d. Each of the multiplexers 20a through 20d and 24a through 24d may include an input for receiving a bit of a divider pattern. The multiplexers 20a through 20d and 24a through 24d may also include an input from the last latch 20a and 26a so as to provide a variable size linear feedback shift register. This input to the mutliplexers 20a through 20d and 24a through 24d provides a variable feedback point in the shift registers to allow the output of the last latch to be fed back to any of the latches in the shift register.

As will be appreciated by those of skill in the art, the linear feedback shift registers could be extended to include more latches by repeating the connection patterns illustrated with respect to the 4 bit shift registers of FIG. 2. Thus, FIG. 2 illustrates the feedback of the last latch 22a and 26a as continuing to a previous multiplexer and the first multiplexer 20d and 24d receiving an input from a previous latch.

As is further seen in FIG. 2, the multiplexers 20a through 20d and 24a through 24d have select inputs which allow for the selection of the input to the latches 22a through 22d and 26a through 26d in the linear feedback shift registers 18a and 18b. The select inputs of the multiplexers select between the feedback from the last latch, the output of a previous latch and a load input (the input corresponding to a bit of P0PAT(0 . . . 3) or P1PAT(0 . . . 3)) from the clock divider pattern generator 10. The selection of the feedback from the last latch allows the linear feedback shift register to change size to accommodate different size divider patterns. The load input allows the shift registers to be loaded with the divider patterns (P0PAT or P1PAT). Finally, the output from the previous latch creates the shift register by providing the output of the previous latch to the input of a next successive in the shift register.

The linear feedback shift registers 18a and 18b are clocked by the out of phase clocks P0 Clock and P1 Clock. Thus the first linear feedback shift register 18a is clocked by P0 Clock and the second linear feedback shift register is clocked by P1 Clock. As is further seen in FIG. 2, the output of the last latches 22a and 26a are connected to an EXCLUSIVE OR (XOR) gate 30 the output of which is the output clock. The outputs of the linear feedback shift registers 18a and 18b provide time varying serial bit patterns which are combined to provide the output clock. By EXCLUSIVE ORing the time varying outputs of the last latches 22a and 26a, a glitch free clock may be generated from the output of the two linear feedback shift registers 18a and 18b.

In operation, the clock divider of FIG. 2 is first loaded with the divider patterns (P0PAT and P1PAT) which are four bit patterns (P0PAT(0 . . . 3) and P1PAT(0 . . . 3)). Thus, the select signals of each of the multiplexers 20a through 20d and 24a through 24d are set to select the load input (the input corresponding to the bit of P0PAT(0 . . . 3) or P1PAT(0 . . . 3)) to the multiplexer. The divider patterns P0PAT and P1PAT are then loaded into the latches by providing a clock pulse or pulses to the latches. Thus, the P0PAT(0) bit of pattern P0PAT is loaded into latch 22a, the P0PAT(1) bit is loaded into latch 22b, the P0PAT(2) bit is loaded into latch 22c, and the P0PAT(3) bit is loaded into latch 22d. Similarly, the P1PAT(0) bit of pattern P1PAT is loaded into latch 26a, the P1PAT(1) bit is loaded into latch 26b, the P1PAT(2) bit is loaded into latch 26c, and the P1PAT(3) bit is loaded into latch 26d.

After loading the latches 22a through 22d and 26a through 26d with the divider bit patterns P0PAT and P1PAT, the select signals for the multiplexers are set to cause the latches to operate as a linear feedback shift register. Thus, SEL0(0:1) is set to provide the output of latch 22b to latch 22a, SEL0(2:3) is set to provide the output of latch 22c to latch 22b, SEL0(4:5) is set to provide the output of latch 22d to latch 22c and SEL0(6:7) is set to provide the output of latch 22a to latch 22d. Similarly, SEL1(0:1) is set to provide the output of latch 26b to latch 26a, SEL1(2:3) is set to provide the output of latch 26c to latch 26b, SEL1(4:5) is set to provide the output of latch 26d to latch 26c and SEL1(6:7) is set to provide the output of latch 26a to latch 26d.

The linear feedback shift registers 18a and 18b are then clocked with the out of phase clocks P0 Clock and P1 Clock and the loaded patterns P0PAT and P1PAT are rotated through the shift registers 18a and 18b. As the patterns rotate through the shift registers, the combination of the values in the last latches 22a and 26a may change up to every one half cycle of P0 Clock and P1 Clock if P0 Clock and P1 Clock are 180 degrees out of phase. This change in combination of the values in the last latches 22a and 26a is utilized to generate the output clock.

The size of the linear feedback registers is generally determined by the number of bits required in the divider patterns to produce the desired output clock. Thus, as is illustrated in FIG. 2, the present invention may utilize X*Y latches, where X is the number of linear feedback registers and Y is the number of bits in the divider patterns. For example, in FIG. 2, 8 latches are used with the two 180 degree out of phase clocks and the 4 bit divider patterns P0PAT and P1PAT to generate the output clock.

Figure 3:
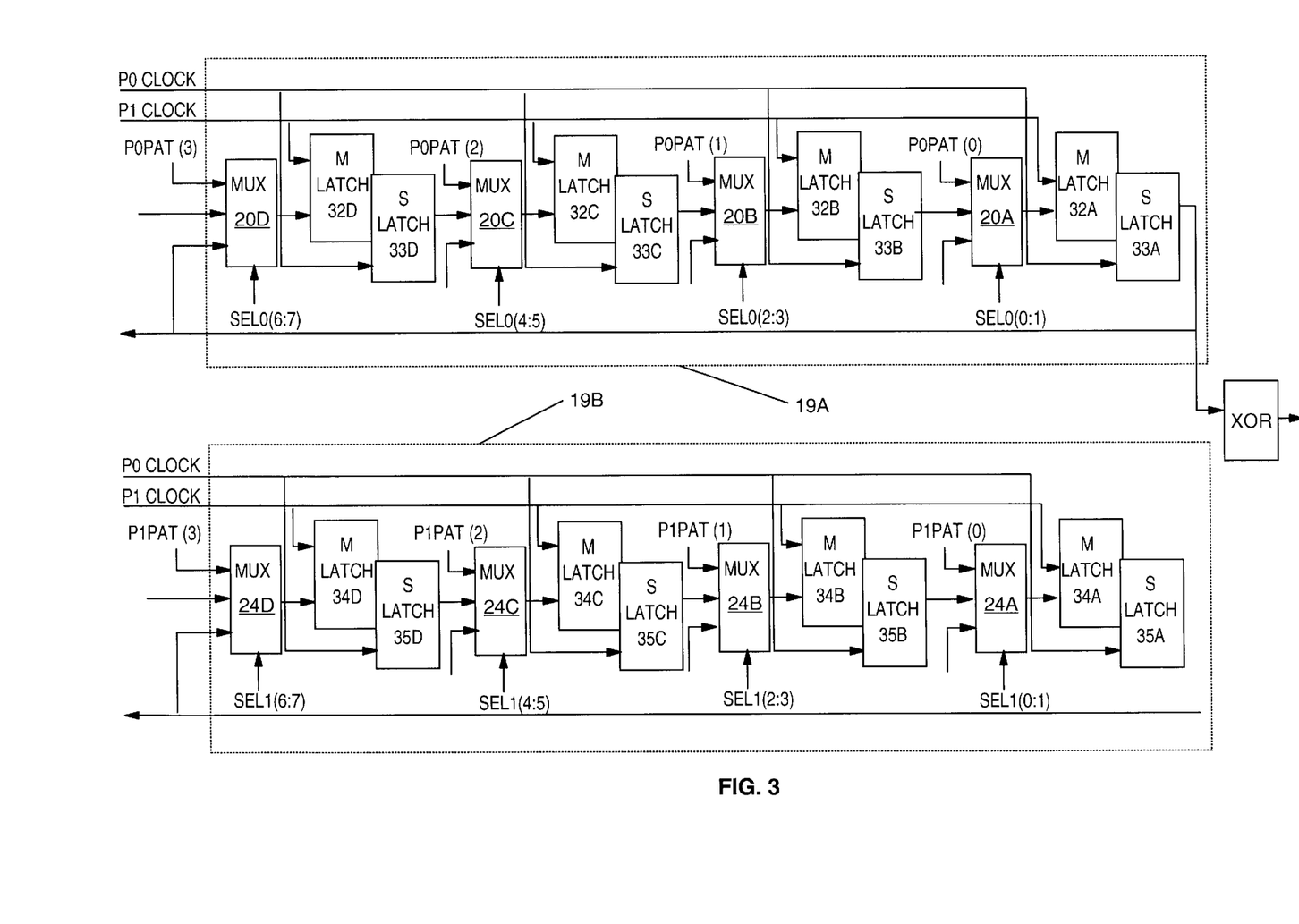
FIG. 3 is a block diagram of an alternative embodiment of a clock divider circuit according to the present invention.

While the embodiment of the present invention illustrated in FIG. 2 utilizes edge triggered latches, other embodiments may be utilized. For example, FIG. 3 illustrates an LSSD implementation of the clock divider 14 where the first linear feedback shift register 19a corresponds to the first linear feedback shift register 18a of FIG. 2 and the second linear feedback shift register 19b corresponds to the second linear feedback shift register 18b of FIG. 2. As seen in FIG. 3, the edge triggered latches 22a through 22d and 26a through 26d are replaced by the transparent master and slave latch pairs 32a and 33a through 32d and 33d and 34a and 35a through 34d and 35d. As is further seen in FIG. 3, the outputs of one master latch are connected to the input of a corresponding slave latch. Thus, for example, the output of master latch 32b is connected to the input of slave latch 33b to provide the master-slave combination. As will be appreciated by those of skill in the art, through the use of the two out of phase clocks and the master-slave latch combinations, the master-slave latches of FIG. 3 provide an LSSD equivalent to the edge triggered latches of FIG. 2.

As is seen in FIG. 3, each linear feedback shift register utilizes both the P1 Clock and the P0 Clock as a master clock and a slave clock to clock the master and slave latches. Furthermore, the output of the last slave latch of the first linear feedback shift register 19a is fed back to the first multiplexer 20d. The output of the last slave latch 33a of the first linear feedback shift register 19a is provided to the XOR gate 30. Similarly, the last slave latch 35a of the second linear feedback shift register 19b is fed back to the first multiplexer 24d. The output of the last master latch 34a of the second linear feedback shift register 19b is connected to the XOR gate 30. Thus, an output synchronized with the P0 Clock and an output synchronized to the P1 Clock are both provided to the XOR gate 30.

The loading and operation of the clock divider illustrated in FIG. 3 is similar to that of the clock divider of FIG. 2. The divider patterns are loaded into the linear feedback shift registers utilizing the select signals to the multiplexers 20a through 20d and 24a through 24d and then latches are clocked with P0 Clock and P1 Clock to cause the patterns to rotate through the linear feedback shift registers.

While the linear feedback shift registers of FIGS. 2 and 3 are illustrated as having feedback from the last latch to each of the multiplexers in the shift register, such feedback need only be provided if variable length clock divider patterns are utilized. Thus, if a fixed length clock divider pattern is utilized, then the feedback need only go to the first multiplexer in the shift register. Furthermore, in the LSSD implementation of FIG. 3, the load input to the multiplexers through which the divider patterns are loaded may be eliminated if the patterns are loaded by scanning. Such a scanning process is well known to those of skill in the art and utilizes the scan string in which the LSSD latches of the shift registers are connected to scan data into the latches utilizing a separate scan input and scan clock (not shown). Thus, if fixed length divider patterns are utilized and the patterns are scanned into the latches, then the multiplexers of FIG. 3 may be eliminated from the linear feedback shift registers, further simplifying the clock divider design. In such an implementation, the output of one latch could be connected directly to the next latch in the shift register and the output of the last latch could be connected directly to a first latch in the shift register.

Figure 4:
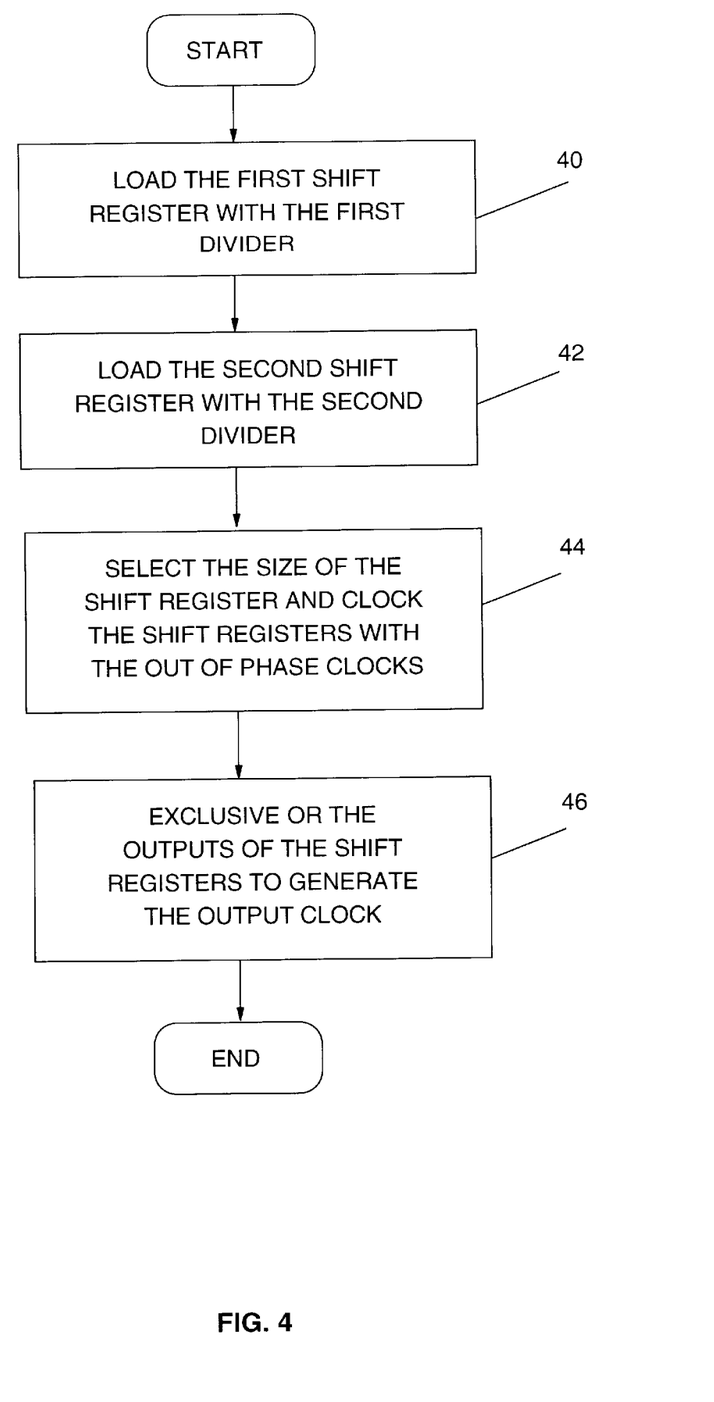
FIG. 4 is flow chart illustrating operations of a clock generator according to the present invention.

FIG. 4 is a flow chart illustration of the operation of a clock generator according to the present invention. As is seen in FIG. 4, in block 40, the first linear feedback shift register 18a or 19a is loaded with a first divider pattern. In block 42, the second linear feedback shift register 18b or 19b is loaded with a second divider pattern. Typically, the first and second divider patterns will be different bit patterns, however, in certain situations it may be possible to use a single bit pattern as both the first and second divider patterns. The size of the shift registers is selected based on the size of the divider pattern and the shift registers 18a and 18b or 19a and 19b are clocked with the out of phase clocks (block 44) to generate a time varying output of the shift registers. The time varying output of the shift registers last latches is EXCLUSIVE ORed to produce the output clock (block 46).

As described above, the clock divider 14 is loaded with divider patterns to produce the desired clock output. The divider patterns may be determined in any number of ways, including through the use of a computer program to calculate a pattern which will result in the desired output clock. One such program for determining patterns in multiple clock systems is illustrated below.

```
# $Up = number of cycles of the multiplied clock that the desired output
  clock is a 1.
# $period = number of cycles of the multiplied clock from rising to rising
  edge of the desired output clock
# Pattern is stored in $P#PATMindex, where # is the phase number
# $num_latches is the number of latches required
# $num_phases is he number of clock phases
# $period is the desired period of the resultant clock
# determine number of latches required
    $found = 0;
    $num_latches = 1;
    while ($found eq 0)
        { # find number of latches required
        if ((($num_phases*$numlatches)%period) eq 0) {$found = 1;}
            else {$num_latches += 1;}
```

-continued

```
    }
    if ((($num_phases*num_latches)/$period) eq 1)
        {$num_latches *= 2;}
# setup pattern Initial, X's for others
    for ($i = 0; $i < $num_latches; $j++)
        {
        for ($j = 0; $j < $num_phases; $j++)
            {
            $ppat = "P".$j."PAT";
            if ($i eq 0)
                {
                if ($j eq 0){push(@$ppat,1);}
                    else {push(@$ppat,0);}
                }
            else {push(@$ppat, X);}
            }
        }
    $iup = 1;
    for ($iper = 1; $iper < num_latches;
    $iper = $iper + 1) # loop through num_latches
        {
        for ($j = 1; $j < $num_phases + 1; $j = $j + 1)
            {
            $res = 0;
            $pnum = $j%$num + phases;
            for ($k = 0; $k < $num_phases; $k = $k + 1)
                {
                $ppat = "P".$k."PAT";
                if($k != $pnum)
                    {
                    if ($k eq 0) {$pindex = $iper - 1 ;}
                        else
                        {
                        if ($k < $j){$pindex = $iper;}
                            else {$pindex = $iper - 1 :}
                        }
                    $res XOR = $$ppatM$pindex";
                    } # end if ($k != $j)
                } # for $k
            $ppat = "P".$pnum."PAT"
            if ($iup < $up) # assign pattern to obtain sysclk = 1
                {
                if ($res eq 0) {$value = 1 ;}
                    else {$value = 0;}
                $$ppatM$iper" = $value
                }
            else # assign pattern to obtain sysclk = 0
                {
                $value = $res;
                $$ppatM$iper" = $value;
                }
            $iup = ($iup + 1)%$period;
            } # for $j
        } # for $iper
```

As is seen in the above PERL program instructions, characteristics of the desired output are input to the program and the programs loop through the clock cycles of the out of phase clocks and determine what latch values at each clock transition which are required to obtain the desired output clock for successive clock cycles of the out of phase clocks. Thus, the program determines one set of divider patterns which, when loaded in the linear feedback shift registers and rotated through the shift registers will provide the desired output clock. As an example, the program sets the values of the divider patterns to equal each other if the desired output is a "0" and sets the divider patterns to be opposite each other if the desired output is a "1" based on the period and pulse width input parameters.

Figure 5:
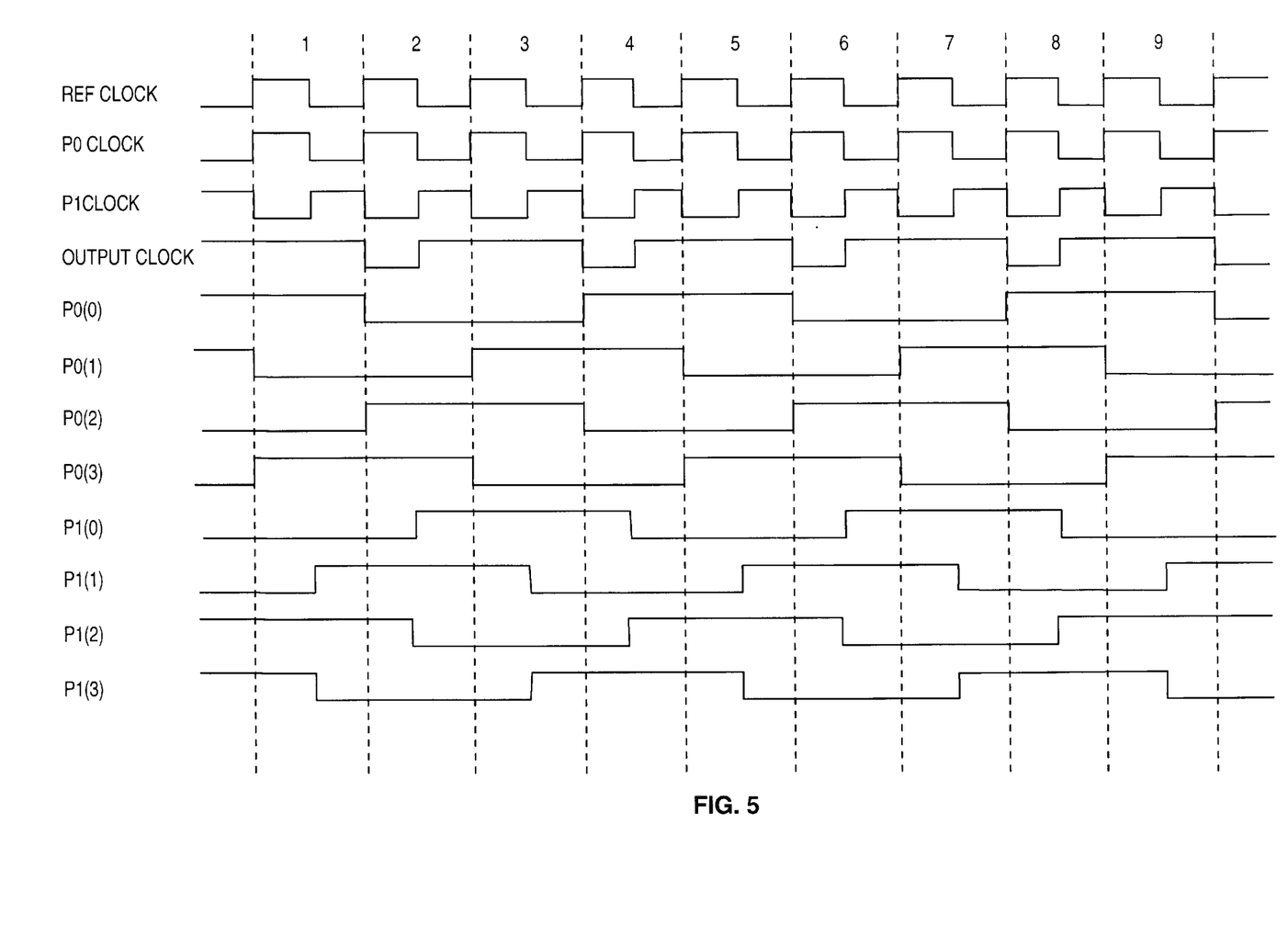
FIG. 5 is a timing diagram illustrating operation of the clock divider of FIG. 2.

FIG. 5 illustrates operation of a clock divider according to the present invention to provide an output clock which has a period of 2 cycles of the reference out of phase clocks and is active for 1.5 clock cycles of the out of phase clocks. As is seen in FIG. 5, the P0 Clock may correspond to a reference clock (Ref Clock). The P1 Clock corresponds to the P0 Clock phase shifted 180 degrees. Initially, the linear feedback shift registers are loaded with the patterns P0PAT= "1100" (latches 22a through 22d respectively) for the first linear feedback shift register and P1PAT="0011" (latches 26a through 26d respectively) for the second linear feedback shift register.

The output of each latch is illustrated in FIG. 5 as the clocks P0 Clock and P1 Clock are applied to the latches in the shift register. Before the cycle 1 of P0 Clock, the latches in the shift register are "1100" and "0011" for latches 22a through 22d and 26a through 26d respectively. Because latch 22a and latch 26a have opposite values, output clock is active (i.e. a "1"). At the rising edge of cycle 1 of P0 Clock, the data in the first shift register rotates and latches 22a through 22d have the value of "1001", respectively. Latches 22a and 26a still have opposite values so the output clock remains active.

On the rising edge of P1 Clock in cycle 1, the data in the second shift register rotates such that latches 26a through 22d contain "0110" as a value. Because latches 22a and 26a still have opposite values, output clock remains active. However, on the rising edge of P0 Clock at the beginning cycle 2, the value in registers 22a through 22d changes to "0011" which results in latches 22a and 26a having the same value. Thus, the output clock goes inactive (i.e. "0"). On the rising edge of P1 Clock in cycle 2 the data in the second shift register rotates to "1100" which causes latches 22a and 26a to once again have opposite values. Thus, on the rising edge of P1 Clock in cycle 2 the output clock once again goes active.

This process is repeated as the data in the shift registers rotates through the shift registers. Thus, as seen in cycles 4 and 5, the output clock again goes inactive for one half of cycle 4 and then is active for the remainder of cycle 4 and all of cycle 5. As can be seen from FIG. 5, the clock divider provides resolution of 1/X the frequency of the out of phase clocks P0 Clock and P1 Clock where X is 2 corresponding to the two linear feedback shift registers. Furthermore, as is seen in FIG. 5, because the outputs are XOR'd and because the shift registers are clocked with out of phase clocks, the potential for glitches on the output clock caused by simultaneous changes in the outputs of the last latches of the shift registers is eliminated, providing the delay of the last latch plus the XOR function is less than the minimum separation of the out of phase clocks.

Figure 6:
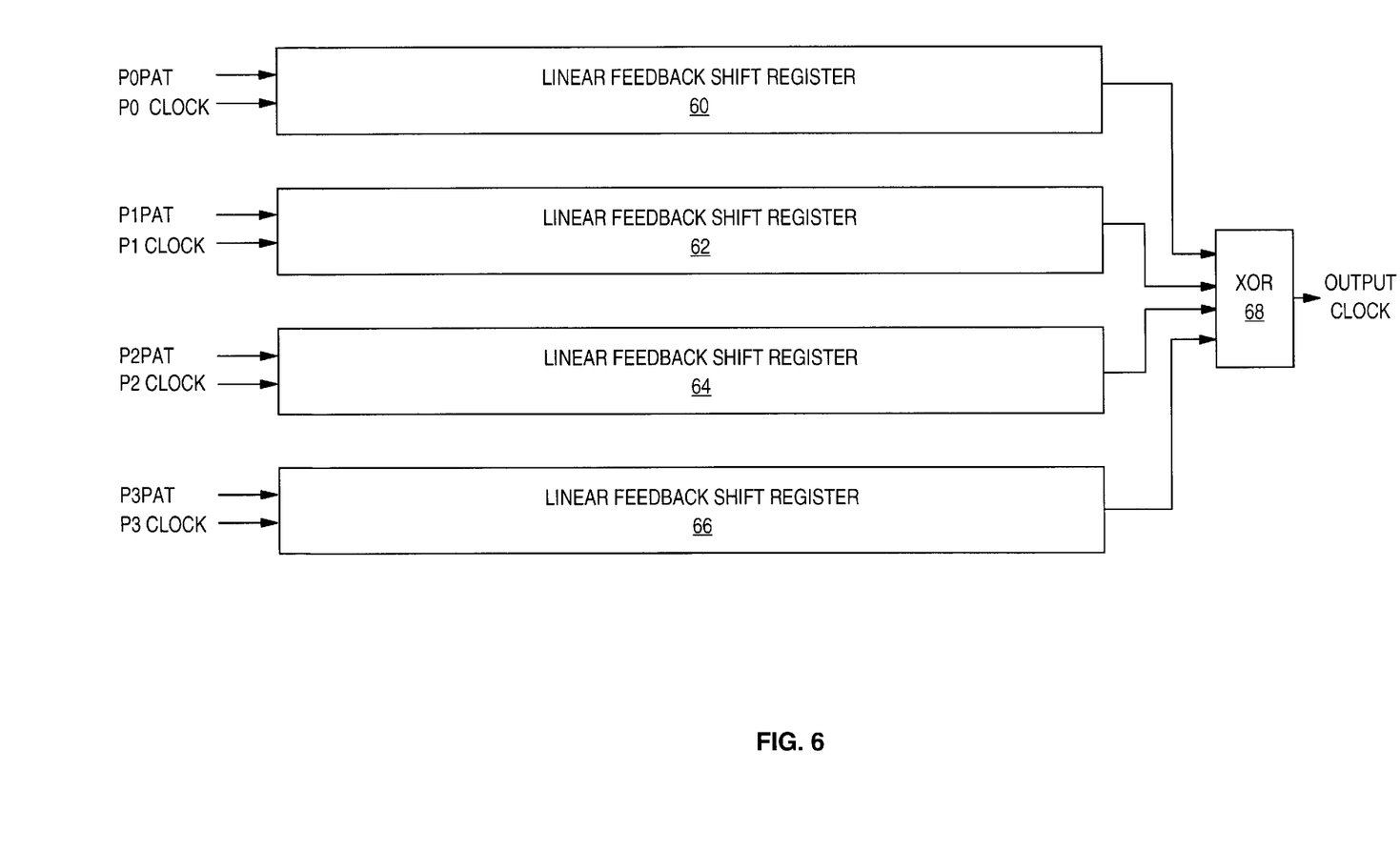
FIG. 6 is a block diagram of a four phase alternative embodiment of the present invention.

While the present invention has been primarily described with respect to a two clock system, as will be appreciated by those of skill in the art, the present invention may be utilized in systems with other numbers of clocks. For example, in a four clock system where each clock is 90 degrees out of phase, four linear feedback shift registers may be utilized and the outputs XORed to provide a desired clock. An example of a four phase system is seen in FIG. 6. As seen in FIG. 6, four linear feedback shift registers 60, 62, 64 and 66 have their outputs connected to an XOR gate 68. Each of the linear feedback shift registers receive their own clock and load inputs. Thus, linear feedback shift register 60 receives phase 0 pattern data (P0PAT) and the phase 0 clock (P0 Clock). Linear feedback shift register 62 receives phase 1 pattern data (P1PAT) and the phase 1 clock (P1 Clock). Linear feedback shift register 64 receives phase 2 pattern data (P2PAT) and the phase 2 clock (P2 Clock). Finally, linear feedback shift register 66 receives phase 3 pattern data (P3PAT) and the phase 3 clock (P3 Clock). These shift registers may have the same configuration as those described above with the primary difference being the source of the load data and the clock input to the shift register.

Figure 7:
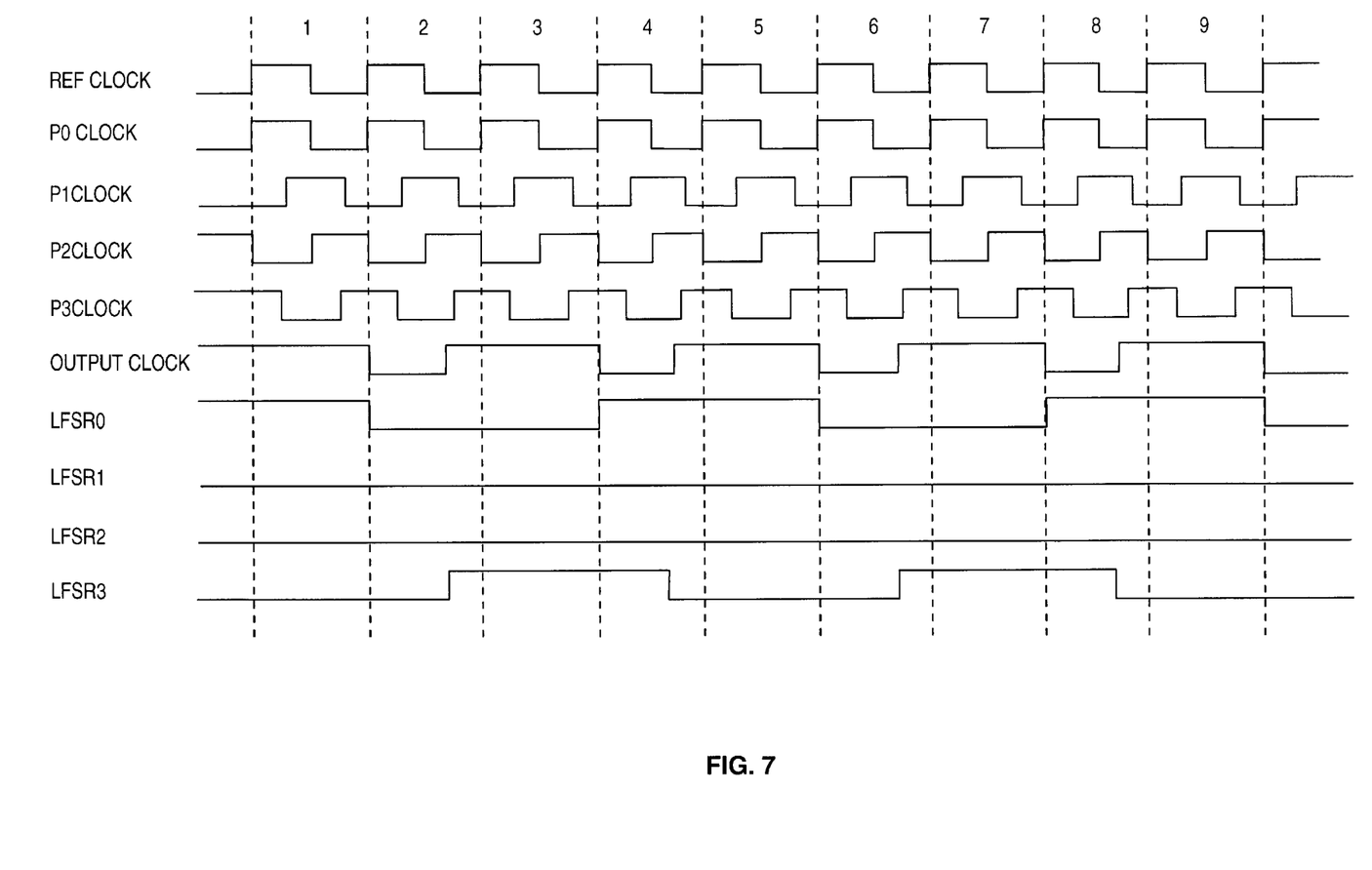
FIG. 7 is a timing diagram illustrating operation of the clock divider of FIG. 6.

FIG. 7 illustrates the operation of the four phase system of FIG. 6 with data loaded in the shift registers of P0PAT= "1100", P1PAT="0000", P2PAT="0000" and P3PAT= "0011." As is seen in FIG. 7, by including the multiple phases in the clock divider system, the frequency and duty cycle of the output clock may be altered.

In a four phase system such as that illustrated in FIG. 6, the resolution of duty cycles would be ¼ the period of the out of phase clocks. Similarly, asymmetric clocks may also be utilized to generate differing duty cycles.

While the four linear feedback shift register system of FIG. 6 provides a great level of flexibility, an alternative system, which may reduce the number of latches utilized and which may also provide increased flexibility, may be provided by a two linear feedback shift register system where the different phase clocks are selectively provided to the linear feedback shift registers. Thus a system with increased resolution could be provided without increasing the number of latches in the clock divider.

While the present invention has been described with respect to the generation of a uniform clock signal, as will be appreciated by those of skill in the art, the present invention could be used to generate any number of repeating patterns. Accordingly, as used herein, the term clock generator refers to a generator which generates a repeating signal pattern.

As will be appreciated by those of skill in this art, the preceding examples are provided, not to limit or define the scope of the present invention, but to illustrate the nature of the present invention and possible uses for the teachings of the present invention. These examples may be modified in many different ways while still obtaining the benefits of the teachings of the present invention.

In the drawings, specification and examples, there have been disclosed typical preferred embodiments of the invention and, although specific terms are employed, these terms are used in a generic and descriptive sense only and not for purposes of limitation, the scope of the invention being set forth in the following claims.

That which is claimed is:

1. A variable clock generator comprising:
a clock multiplier that is responsive to a reference clock and which generates at least two clock signals which are out of phase with each other; and
a clock divider which is responsive to at least one divider pattern and which is operably associated with the clock multiplier for receiving the at least two clock signals from the clock multipler to generate an output clock based on the divider patterns and the clock signals;
wherein the clock divider comprises:
a plurality of loadable linear feedback shift registers each having an output; and
an EXCLUSIVE OR gate that is responsive to the outputs of the linear feedback shift registers to produce the output clock.

2. A variable clock generator according to claim 1, wherein the size of the linear feedback shift registers corresponds to a size of the divider pattern.

3. A variable clock generator according to claim 1, wherein the linear feedback shift registers each comprise:
an alternating series of multiplexers and latches including a first multiplexer and a last latch, the outputs of a preceding latch being connected to the input of a succeeding multiplexer and outputs of the preceding multiplexer being connected to the input of a succeeding latch and wherein the output of the last latch is connected to the input of the first multiplexer and wherein each of the multiplexers includes an input for receiving a bit of a divider pattern.

4. A variable clock generator according to claim 3, wherein each of the multiplexers further receives as an input the output of the last latch.

5. A variable clock generator according to claim 3, wherein the at least two clock signals comprise a master clock and a slave clock and wherein each of the latches of the linear feedback shift registers comprise:
a master latch clocked by the master clock; and
a slave latch which receives an output of the master latch and is clocked by the slave clock.

6. A variable clock generator according to claim 1 wherein latches of the linear feedback shift registers comprise a plurality of level sensitive scan design latches.

7. A variable clock generator according to claim 1, wherein the plurality of linear feedback shift registers comprise two linear feedback shift registers and wherein the clock multiplier provides two clocks which are about 180 degrees out of phase.

8. A clock divider for a variable clock generator, comprising:
a plurality of loadable linear feedback shift registers a respective one of which is responsive to a respective one of a plurality of divider patterns and to a respective one of a plurality of clock signals; and
an EXCLUSIVE OR gate that is responsive to the linear feedback shift registers to produce an output clock.

9. A clock divider according to claim 8, wherein the size of the linear feedback shift registers corresponds to the size of the divider patterns.

10. A clock divider according to claim 7, wherein the linear feedback shift registers each comprise:
an alternating series of multiplexers and latches including a first multiplexer and a last latch, the outputs of a preceding latch being connected to the input of a succeeding multiplexer and outputs of the preceding multiplexer being connected to the input of a succeeding latch and wherein the output of the last latch is connected to the input of the first multiplexer and wherein each of the multiplexers includes an input for receiving a bit of a divider pattern.

11. A variable clock generator according to claim 10, wherein each of the multiplexers further receives as an input the output of the last latch.

12. A clock divider according to claim 10, wherein separate clock signals for clocking the linear feedback shift registers comprise a master clock and a slave clock and wherein each of the latches of the plurality of latches comprise:
a master latch clocked by the master clock; and
a slave latch which receives an output of the master latch and is clocked by the slave clock.

13. A clock divider according to claim 8 wherein latches of the linear feedback shift registers comprise a plurality of level sensitive scan design latches.

14. A clock divider according to claim 8, wherein the loadable linear feedback shift registers comprise two linear feedback shift registers which are clocked by two clocks which are about 180 degrees out of phase.

15. A method of generating a clock from at least two out of phase clocks, the method comprising:
loading a first linear feedback shift register which is clocked by a first of the at least two out of phase clocks with a first bit pattern corresponding to a first characteristic of the clock to be generated;

loading a second linear feedback shift register which is clocked by a second of the at least two clocks with a second bit pattern corresponding to a second characteristic of the clock to be generated; and then clocking the first and second linear feedback shift registers with the first and second clocks so as to provide a first time varying output of the first linear feedback shift register and a second time varying output of the second linear feedback shift register; and EXCLUSIVE ORing the first output and the second output so as to provide the clock to be generated.

16. A method according to claim 15, further comprising the step of selecting the feedback point of the first linear feedback shift register and a feedback point of the second linear feedback shift register based on a the number of bits in the first bit pattern and the second bit pattern.

17. A method according to claim 15, further comprising the step of selecting the first bit pattern and the second bit pattern to specify the rising and falling edges of the output clock.

18. A method according to claim 17, wherein said step of selecting comprises the step of determining the first bit pattern and the second bit pattern based on the period of the output clock and the number of cycles of the out of phase clocks that the output clock is to be active.

19. A method according to claim 15, wherein said steps of loading a first linear feedback shift register and loading a second linear feedback shift registers comprise the step of scanning a first bit pattern corresponding to a first characteristic of the clock to be generated into the first linear feedback shift register and a second bit pattern corresponding to a second characteristic of the clock to be generated into the second linear feedback shift register.

20. An apparatus for generating a clock from at least two out of phase clocks, comprising:

means for loading a first linear feedback shift register which is clocked by a first of the at least two clocks with a first bit pattern corresponding to a first characteristic of the clock to be generated;

means for loading a second linear feedback shift register which is clocked by a second of the at least two clocks with a second bit pattern corresponding to a second characteristic of the clock to be generated;

means for clocking the first and second linear feedback shift registers with the first and second clocks so as to provide a first time varying output of the first linear feedback shift register and a second time varying output of the second linear feedback shift register; and means for EXCLUSIVE ORing the first output and the second output so as to provide the clock to be generated.

21. An apparatus according to claim 20, further comprising means for selecting the feedback point of the first linear feedback shift register and a feedback point of the second linear feedback shift register based on a the number of bits in the first bit pattern and the second bit pattern.

22. An apparatus according to claim 20, further comprising means for selecting the first bit pattern and the second bit pattern to specify the rising and falling edges of the output clock.

23. An apparatus according to claim 22, wherein said means for selecting comprises means for determining the first bit pattern and the second bit pattern based on the period of the output clock and the number of cycles of the out of phase clocks that the output clock is to be active.

24. An apparatus according to claim 20, wherein said means for loading a first linear feedback shift register and said means for loading a second linear feedback shift registers comprise means for scanning a first bit pattern corresponding to a first characteristic of the clock to be generated into the first linear feedback shift register and a second bit pattern corresponding to a second characteristic of the clock to be generated into the second linear feedback shift register.

* * * * *